(12) United States Patent
Grundbacher et al.

(10) Patent No.: US 6,569,763 B1
(45) Date of Patent: May 27, 2003

(54) METHOD TO SEPARATE A METAL FILM FROM AN INSULATING FILM IN A SEMICONDUCTOR DEVICE USING ADHESIVE TAPE

(75) Inventors: Ronald W. Grundbacher, Hermosa Beach, CA (US); Po-Hsin Liu, Anaheim, CA (US); Rosie M. Dia, Carson, CA (US)

(73) Assignee: Northrop Grumman Corporation, Redondo Beach, CA (US)

( * ) Notice: Subject to any disclaimer, the term of this patent is extended or adjusted under 35 U.S.C. 154(b) by 0 days.

(21) Appl. No.: 10/119,638

(22) Filed: Apr. 9, 2002

(51) Int. Cl.$^7$ ............................................... H01L 21/44
(52) U.S. Cl. ...................................... 438/670; 438/759
(58) Field of Search ................................. 438/172, 577, 438/670, 759

(56) References Cited

U.S. PATENT DOCUMENTS

| | | | |
|---|---|---|---|
| 3,633,269 A | * 1/1972 | Bachmeier | 438/670 |
| 4,040,891 A | * 8/1977 | Chang et al. | 438/638 |
| 4,067,100 A | * 1/1978 | Kojima et al. | 438/670 |
| 4,076,575 A | * 2/1978 | Chang | 438/622 |
| 5,240,878 A | * 8/1993 | Fitzsimmons et al. | 438/670 |
| 5,262,660 A | 11/1993 | Streit et al. | |
| 5,528,769 A | 6/1996 | Berez et al. | |
| 5,668,387 A | 9/1997 | Streit et al. | |
| 5,725,786 A | * 3/1998 | Bayraktaroglu | 216/12 |
| 5,736,417 A | 4/1998 | Oki et al. | |
| 5,804,487 A | 9/1998 | Lammert | |
| 5,892,248 A | 4/1999 | Oki et al. | |
| 5,976,920 A | 11/1999 | Nakano et al. | |
| 5,994,982 A | 11/1999 | Kintis et al. | |
| 6,028,328 A | 2/2000 | Riechert et al. | |
| 6,049,097 A | 4/2000 | Hida | |
| 6,100,542 A | 8/2000 | Kohara et al. | |
| 6,177,685 B1 | 1/2001 | Teraguchi et al. | |
| 6,232,624 B1 | 5/2001 | Matloubian et al. | |
| 6,365,478 B1 | 4/2002 | Block et al. | |

OTHER PUBLICATIONS

Grundbacher, R. et al., "InP HEMT's with 39% PAE and 162–mW Output Power at V–Band," *IEEE Microwave and Guided Wave Letters*, vol. 9, No. 6, Jun. 1999.

Archer, J. et al., "An Indium Phosphide MMIC Amplifier for 180–205 GHz," *IEEE Microwave and Wireless Components Letters*, vol. 11, No. 1, Jan. 2001.

Grundbacher, R. et al., "Pseudomorphic InP HEMT's with Dry–Etched Source Vias Having 190 mW Output Power and 40% PAE at V–Band," *IEEE Electron Device Letters* vol. 20, No. 10, Oct. 1999.

Murti, M. R. et al. "Temperature–Dependent Small–Signal and Noise Parameter Measurements and Modeling on InP HEMTs," *IEEE Transactions on Microwave Theory and Techniques*, vol. 48, No. 12, Dec. 2000.

Lai R. et al., "InP HEMT Amplifier Development for G–Band (140–220 GHz) Applications," *International Electron Devices Meeting*, San Francisco, California, Dec. 10–13, 2000, pp. 175–177.

(List continued on next page.)

*Primary Examiner*—Richard Elms
*Assistant Examiner*—Beth E. Owens
(74) *Attorney, Agent, or Firm*—Katten Muchin Zavis Rosenman

(57) ABSTRACT

A process for improving the yield of semiconductors, such as high electron mobility transistors (HEMTs), which are susceptible to damage during conventional metal lift-off techniques. In accordance with an important aspect of the invention, damage to relatively fragile structures, such as submicron dimensioned structures on semiconductors are minimized by utilizing an adhesive tape to peel off undesired metal in close proximity to submicron dimension structures. By using an adhesive tape to peel off undesired metal, damage to submicron dimension structures is minimized thus improving the yield.

13 Claims, 1 Drawing Sheet

OTHER PUBLICATIONS

Lai, R. et al.,"Extremely High P1dB MMIC Amplifiers for Ka–Band Applications," *2001 IEEE GaAs Digest*, 2000, pp. 115–117.

Streit D. et al., "InP HBT Technology and Applications," *10th Inter. Conf. on Indium Phosphide and Related Materials*, May 11–15, 1998, Tsukuba, Japan, pp. 65–67.

Streit D., "Indium Phosphide HEMT and HBT Production for Microwave and Millimeter–Wave Applications," *2001 Annual Pacific Microwave Conference*, vol. 1, pp. 9–14, Dec. 3–6, 2000,.

Lai, R. et al., "0.1 $\mu$ m InGaAs/InAlAs/InP HEMT Production Process for High Performance and High Volume MMW Applications," 1999 *GaAs MANTECH Conference*, Apr. 19–22, 1999, Vancouver, British Columbia, Canada, pp. 249–252.

Chen, Y.C., et al., "21 GHz Highly Efficient Composite–Channel InP HEMT," *2000 International Conference on Indium Phosphide and Related Materials, Conference Proceeding*, Williamsburg, Virginia, May 14–18, 2000, pp. 75–78.

Grundbacher, R., et al., "InP Power HEMTs with 36% PAE at 60 GHz," *1999 Eleventh International Conference on Indium Phosphide and Related Materials, Conference Proceeding*, Davos, Switzerland, May 16–20, 1999, pp. 307–310.

Streit D. et al., "High Performance Low Cost Indium Phosphide MMICs for Commercial Wireless Applications," *Digest, IEEE MTT–S Symposium on Technologies for Wireless Applications*, Vancouver, B.C., Canada, Feb. 21–24, 1999, pp. 253–256.

Oki, et al., "InP HBT and HEMT Technology and Applications," Conference Proceedings, *2000 International Conference on Indium Phosphide and Related Materials*, Williamsburg, Virginia, May 14–18, 2000, pp. 7–8.

Chou, Y.C., et al., "High Reliability Non–Hermetic 0.1/spl mu/m GaAs Pseudo HEMT MMIC Amplifiers," *23rd Annual Digest Gallium Arsenide Integrated Circuit (GaAs IC)*, Baltimore, Maryland, Oct. 21–24, 2001, pp. 170–173.

* cited by examiner

METHOD TO SEPARATE A METAL FILM FROM AN INSULATING FILM IN A SEMICONDUCTOR DEVICE USING ADHESIVE TAPE

BACKGROUND OF THE INVENTION

1. Field of the Invention

The present invention relates to a semiconductor fabrication process and more particularly to a process for fabricating semiconductors, such as high electron mobility transistor (HEMT) and heterojunction bipolar transistor (HBT) semiconductors, which eliminates damage to a device during lift-off of undesired metal.

2. Description of the Drawings

High electron mobility transistors (HEMTs) are well known in the art. Examples of such HEMTs are disclosed in U.S. Pat. Nos. 6,232,624; 6,177,685; 6,100,542; 6,049,097; 6,028,328 and 5,976,920 and commonly owned U.S. Pat. Nos. 5,668,387 and 5,528,769. HEMTs are also extensively covered in the literature: "Temperature-Dependent Small Signal and Noise Parameter Measurements and Modeling on InP HEMTs," Murti et al., *IEEE Transactions on Microwave Theory and Techniques,* Volume 48, No. 12, December 2000, pp. 2579–2587; "Pseudomorphic InP HEMT's With Dry Etched Source Vias Having 190-mW Output Power and 40% PAE at V-Band," by Grundbacher et al., *IEEE Electron Device Letters,* Volume 20, No. 10, October 1999, pp. 517–519; and "InP HEMT's With 39% PAE and 162-mW Output Power at V-Band," Grundbacher et al., *IEEE Microwave and Guided Wave Letters,* Volume 9, No. 6, June 1999.

Such HEMTs are used in various low-noise and power microwave applications where relatively high-device output power, power added efficiency and noise performance are critical. Such HEMTs have been known to be used in Q, V and W-Band microwave applications in commercial and military radar systems and communication systems.

Such HEMTs are known to be integrated into monolithic microwave integrated circuits (MMICS) for use in various applications as discussed above. Such MMICs are also well described in the literature; "An Indium Phosphide MMIC Amplifier For 180–205 GHz" by Archer et al., *IEEE Microwave and Wireless Components Letters,* Volume 11, No. 1, January 2001, pp. 4–6; "InP REMT Amplifier Development for G-Band (140–220 GHz) Applications by Lai et al., Digest Technical International Electron Devices Meeting, San Francisco, Calif. on Dec. 10–13, 2000, pp., 175–177; "High Reliability Non-Hermetic," and "Extremely High P1 dB MMIC Amplifiers for Ka-Band Applications" by Lai et al., *Gallium Arsenide Integrated Circuits (GAAsIC) System* 2001, *Twenty-Third Annual Technical Digest.* Oct. 21–24, 2001, Baltimore, Md., pp. 115–117.

Such HEMTs are formed by conventional photolithography techniques and include a T-gate structure that is susceptible to damage during conventional metal lift-off techniques, thereby lowering the yield of such devices. More particularly with reference to FIG. 1, an intermediate process step for a HEMT is shown which illustrates the formation of the gate structures, identified with the reference numerals 20 and 22. These gate structures 20 and 22 are formed on top of a multi-layered structure, generally identified with the reference numeral 24. In order to form the desired gate structure, two levels of photo-resist 26 and 28 and masking steps are used to develop the T-gate structure 20 and 22 shown. An undesired metallization layer 30 is formed during the deposition of the metal on top of the photo-resist layers 26 and 28 to form the T-gate structures 20 and 22 shown.

The undesired metallization layer 30 and photoresist layers 26 and 28 are removed by conventional metal lift-off techniques which normally involve soaking the entire structure in a solvent solution, typically acetone. The solvent solution dissolves the photoresist layers 26 and 28 underneath the undesired gate metal layer 30. Once the photoresist layers 26 and 28 are dissolved, the undesired gate metal 30 is known to float off the wafer leaving the desired gate structures 20 and 22. Unfortunately, when the photoresist layers 26 and 28 are dissolved, the undesired gate metal layer 30 is known to break into pieces that can scratch or damage adjacent submicron structures, such as the T-gates 20 and 22 which at the neck are on the order of 0.1–0.15 microns. Damage to the gate structures 20 and 22 can result in a lower yield for the process. Thus, there is a need to prevent metal lift-off from damaging such gate structures to improve the yield.

SUMMARY OF THE INVENTION

The present invention relates to a process or improving the yield of semiconductors, such as high electron mobility transistors (HEMTs), which are susceptible to damage during conventional metal lift-off techniques. In accordance with an important aspect of the invention, damage to relatively fragile structures, such as submicron dimensioned structures on semiconductors are minimized by utilizing an adhesive tape to peel off undesired metal in close proximity to submicron dimension structures. By using an adhesive tape to peel off undesired metal, damage to submicron dimension structures is minimized thus improving the yield.

DESCRIPTION OF THE DRAWING

These and other advantages of the present invention will be readily understood with reference to the following specification and attached drawing wherein.

DETAILED DESCRIPTION

Figure 1:
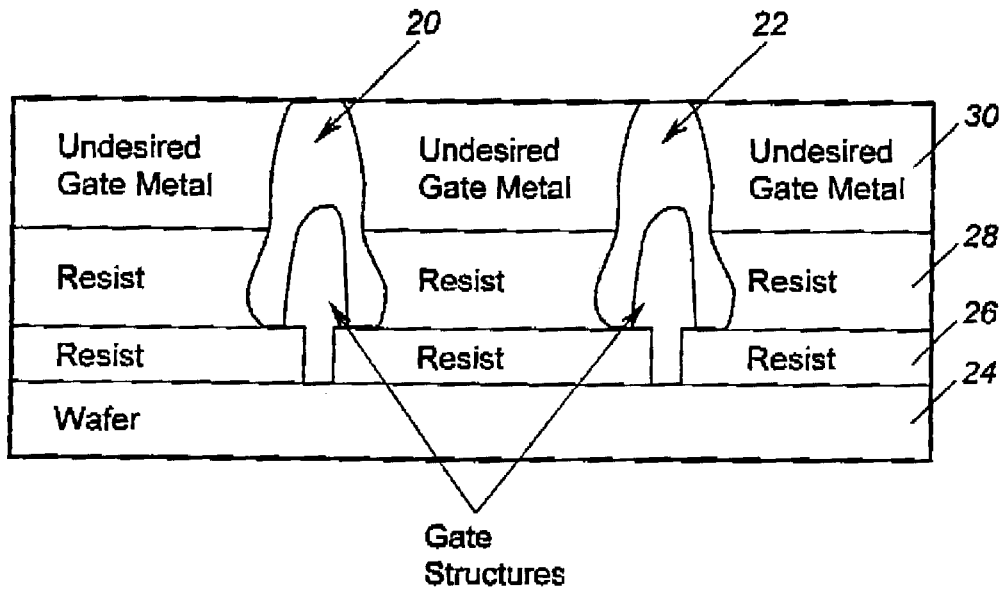
FIG. 1 is a process diagram of a known semiconductor device illustrating an intermediate step in the process just prior to lift-off of an undesired an undesired metallization layer.

The present invention relates to a process for minimizing damage to submicron structures on a semiconductor device resulting from conventional metal lift-off techniques. In accordance with the present invention, rather than relying on conventional metal lift-off techniques, as discussed above, an adhesive tape 32 is used to lift off undesired gate metal. The use of the adhesive 32 allows for a clean lift-off of undesired gate metal 30 adjacent to submicron dimensioned structures, such as the gates 20 and 22.

In particular, the process in accordance with the present invention can be integrated with known semiconductor processing techniques by utilizing the adhesive to remove undesired metal in place of conventional metal lift-off process. As discussed above, submicron gate structures, such as the gate structures 20 and 22 on HEMTs, are known to be subject to damage. By utilizing the adhesive process in place of conventional metal lift-off techniques to remove unwanted metal, damage to such structures may be minimized, if not eliminated.

Although the process is described and illustrated with respect to a high electron mobility transistor (HEMT), the principles of the present invention are applicable to any semiconductor device, such as heterojunction bipolar transistors (HBT), which includes relatively small dimensioned structures, such as submicron dimensioned structures.

Exemplary techniques for fabricating HEMTs are disclosed in commonly owned U.S. Pat. Nos. 5,668,387; and 5,262,660. Techniques for fabricating HEMTs are also disclosed in the literature: "A High Volume 0.1 μm InP HEMT Production Process for Applications from 2 GHz to 200 GHz,":Lai et al., *Proceeding PROC. INT. CONF. GaAs Manufact. Technol.*, Apr. 19, 1999, pp. 241–244; "InP HEMT's With 39% PAE and 162-mW Output Power at V-Band," supra; "21 GHz Highly Efficient Composite-Channel InP HEMT," supra and "InP Power HEMTs with 36% PAE at 60 GHz," supra all hereby incorporated by reference.

Examples of processes for fabricating HBTs are disclosed in commonly owned U.S. Pat. Nos. 6,365,478; 5,736,417; 5,804,487; 5,892,248 and 5,994,982. Processes for fabricating HBTs are also disclosed in the literature: "Indium Phosphide HEMT and HBT Production for Microwave Millimeter Wave Applications," Streit et al., 2001 Annual Pacific Microwave Conference, 2001, Dec. 3–6, 2001, pp. 9–14, Volume 1; and "InP HBT Technology and Applications," Streit et al., 1998 International Conference on Indium Phosphide and Related Materials, Tsukuba-Japan, May 11–15, 1998, pp. 64–67, all hereby incorporated by reference.

Figure 2:
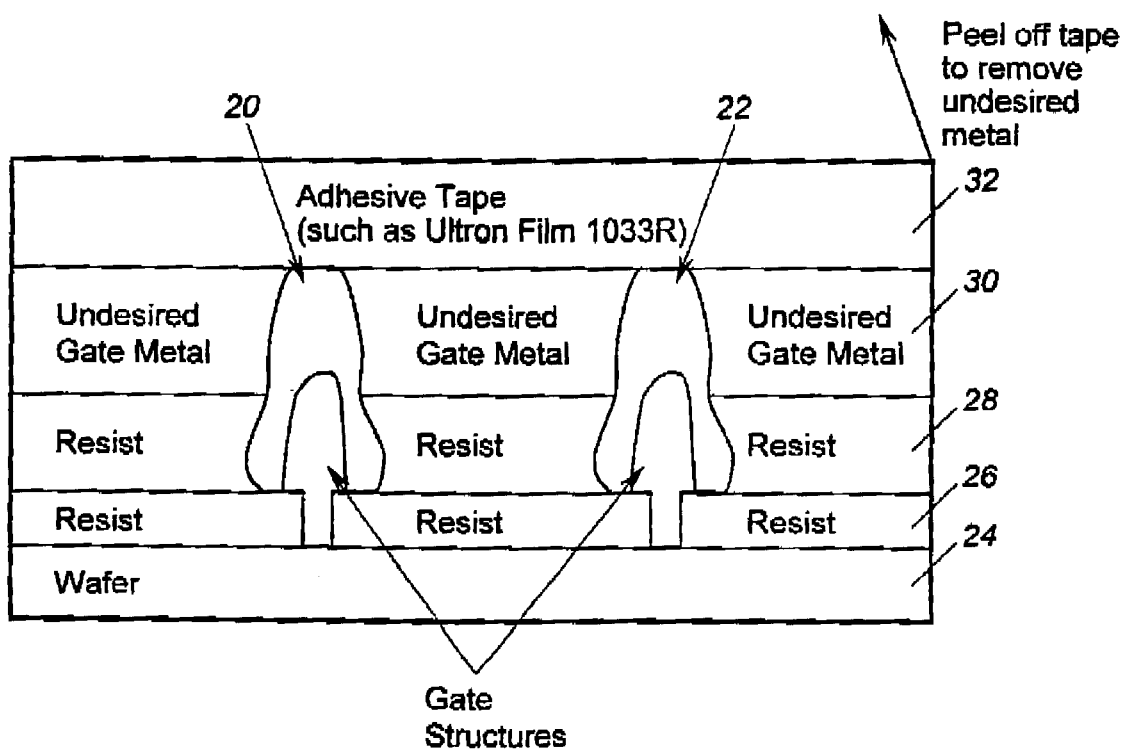
FIG. 2 is similar to FIG. 1 however illustrating lift-off of the undesired metallization layer using an adhesive tape in accordance with the present invention to prevent damage to submicron dimension structures on the device.

Referring to FIG. 2, an exemplary HEMT semiconductor structure is shown at an intermediate processing step forming the T-shaped gate structures 20 and 22. As discussed above, in order to form the T-gate structures 20 and 22, two lawyers of photoresist 26 and 28 are applied or shown. The deposition of the gate metal results in an undesired metallization layer 30 on top of the photoresist layers 28 and 26. As mentioned above, utilizing conventional metal lift-off techniques can result in the undesired metallization layer 30 breaking into pieces and possibly damaging the gate structures 20 and 22. In order to minimize this problem, an adhesive tape 32 is placed over the undesired gate metal. The adhesive tape is then peeled away from the semiconductor structure which, in turn, removes the undesired metallization layer without damaging the adjacent submicron structure, such as the gate structures 20 and 22. Once the undesired metallization layer 30 is removed, the semiconductor may then be soaked in a solvent, such as acetone to remove the photoresist layers 26 and 28.

Various types of adhesive tapes are suitable for this application. For example, various adhesive tapes available from Ultron Systems, Inc. in Moorpark, Calif. are suitable such as Model Nos. 1033R; 1004R; 1008R and 1010R. Adwill E-6142S UV curable tape, available from Lintec Corp. is also suitable. Such adhesives are normally used for semiconductor dicing and backgrinding processes.

The adhesive may be applied by various methods. For example, a Model No. UH114 wafer-frame film applicator, available from Ultron Systems, may be used. Such a device is commonly used to apply adhesives for semiconductor dicing and backgrinding processes. The tape may then be applied using conventional techniques. In particular, using a vacuum wand, a wafer is placed in the machine on a wafer chuck. The wafer is placed such that the wafer faces either the front or the back of the machine's wafer chuck. The wafer is then oriented such that there is no metal on the front edge of the wafer. After the wafer is disposed within the machine, a vacuum is activated and the end of the tape is pulled by the operator to the end of the wafer plates. A pressure is applied on top of the tape around the wafer by the operator to make the tape stick to the plates. A roller is slowly pulled over the entire wafer until it stops. The tape is then cut by depressing a tape cutter button. After the tape is cut, a small portion of the tape, for example, a half of an inch, is unrolled from the front wafer and applied to a Teflon roller. The Teflon roller is rolled towards the back of the machine over the entire width to remove the metal from the wafer. Should the metal break off when the rolling is initiated, the roller is rolled back to the edge of the wafer and then slowly rolled again over the entire wafer. After the metal is lifted off, the vacuum is turned off and the wafer is removed from the wafer chuck using a vacuum wand. Subsequently, the tape is unrolled and removed with the metal from the Teflon holder. The tape may be recycled for the precious metals.

Obviously, many modifications and variations of the present invention are possible in light of the above teachings. Thus, it is to be understood that, within the scope of the appended claims, the invention may be practiced otherwise than as specifically described above.

What is claimed and desired to be covered by a Letters Patent is as follows:

1. A process for fabricating a semiconductor device comprising the steps of:

forming a semiconductor device which includes one or more photoresist layers and an undesired metallization layer thereupon;

applying an adhesive tape to the undesired metallization layer; and peeling the adhesive tape and undesired metallization away from the semiconductor device to remove the undesired metallization layer to thereby minimize damage to said semiconductor device, while leaving said one or more photoresist layers.

2. The process as recited in claim 1, further including the step of:

soaking the semiconductor device in a solvent to remove said one or more layers of photoresist material.

3. The process as recited in claim 2, wherein the soaking step is performed after the peeling step.

4. A process for fabricating a semiconductor device comprising the steps of:

forming a semiconductor device which includes one or more photoresist layers and an undesired metallization layer thereupon;

applying an adhesive tape to the undesired metallization layer; and peeling the adhesive tape away from the semiconductor device to remove the undesired metallization layer to thereby minimize damage to said semiconductor device, wherein said adhesive tape is applied by way of a wafer-frame film application machine.

5. The process as cited in claim 4, wherein the applying step includes the steps of:

disposing the semiconductor device in a wafer chuck;

placing adhesive tape over the semiconductor device;

applying pressure to the adhesive tape to cause the tape to stick to the semiconductor device; and cutting the adhesive tape.

6. A process for forming an HEMT device comprising:

(a) forming a multi-layered HEMT structure;

(b) forming an electrode structure on said multi-layered HEMT structure which includes the steps of:

(i) applying one or more layers of photoresist;
(ii) applying metal to form an electrode as well as an undesired metallization layer;

(c) applying an adhesive tape to said undesired metallization layer; and (d) peeling off said adhesive tape and said undesired metallization layer.

7. The process as recited in claim 6, further including the step of removing said one or more layers of the photoresist.

8. The process as recited in claim 7, wherein the step of removing said one or more layers of photoresist includes the step of soaking the formed electrode structure on said multi-layered HEMT structure in a solvent.

9. The process as recited in claim 7, wherein the step of removing said one or more layers of photoresist is performed after the step of peeling.

10. A process for forming an HBT device comprising:

(a) forming a multi-layered HBT structure;

(b) forming an electrode structure on said multi-layered HBT structure including the steps of:

(i) applying one or more layers of photoresist;
(ii) applying metallization to form an electrode as well as an undesired metal layer;

(c) applying an adhesive tape to said metallization layer on said undesired metallization layer; and (d) peeling off said adhesive tape and undesired metallization layer.

11. The process as recited in claim 10, further including the step of removing said one or more layers of the photoresist.

12. The process as recited in claim 11, wherein the step of removing said one or more layers of photoresist includes the step of soaking the formed electrode structure on said multi-layered HBT structure in a solvent.

13. The process as recited in claim 12, wherein the step of removing said one or more layers of photoresist is performed after the step of peeling.

\* \* \* \* \*